US012706141B2

(12) United States Patent
Chen et al.

(10) Patent No.: US 12,706,141 B2
(45) **Date of Patent: *Aug. 11, 2026**

(54) ERASE OPERATION WITH ELECTRON INJECTION FOR REDUCTION OF CELL-TO-CELL INTERFERENCE IN A MEMORY SUB-SYSTEM

(71) Applicant: Micron Technology, Inc., Boise, ID (US)

(72) Inventors: Hong-Yan Chen, San Jose, CA (US); Priya Vemparala Guruswamy, Boise, ID (US); Pamela Castalino, Boise, ID (US); Tomoko Ogura Iwasaki, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/987,269

(22) Filed: Dec. 19, 2024

(65) Prior Publication Data

US 2025/0118365 A1 Apr. 10, 2025

Related U.S. Application Data

(63) Continuation of application No. 18/085,986, filed on Dec. 21, 2022, now Pat. No. 12,211,548.

(60) Provisional application No. 63/293,409, filed on Dec. 23, 2021.

(51) Int. Cl.

| | |
|---|---|
| ***G11C 11/00*** | (2006.01) |
| ***G11C 11/56*** | (2006.01) |
| ***G11C 16/08*** | (2006.01) |

(52) U.S. Cl.
CPC .......... *G11C 11/5635* (2013.01); *G11C 16/08* (2013.01)

(58) Field of Classification Search
CPC ...... G11C 11/08; G11C 11/5635; G11C 16/08
See application file for complete search history.

(56) References Cited

U.S. PATENT DOCUMENTS

| | | | | |
|---|---|---|---|---|
| 7,142,455 | B1 * | 11/2006 | Lee | G11C 11/5635 365/185.02 |
| 10,861,571 | B1 * | 12/2020 | Yang | G11C 16/24 |
| 2007/0002620 | A1 | 1/2007 | Fastow et al. | |
| 2013/0124787 | A1 * | 5/2013 | Schuette | G11C 16/0483 711/103 |
| 2013/0301352 | A1 | 11/2013 | Shim et al. | |
| 2019/0362798 | A1 * | 11/2019 | Yang | G06F 11/1048 |

* cited by examiner

*Primary Examiner* — Craig S Goldschmidt
(74) *Attorney, Agent, or Firm* — Lowenstein Sandler LLP

(57) ABSTRACT

Control logic in a memory device causes a programming pulse to be applied to a set of wordlines, where the programming pulse causes a set of electrons to be injected into a first set of gate regions and a second set of gate regions. The control logic executes a first erase sub-operation on a first subset of the set of wordlines to remove a first subset of the set of electrons from the first set of gate regions. The control logic executes a second erase sub-operation on a second subset of the set of wordlines to remove a second subset of the set of electrons from the second set of gate regions.

20 Claims, 10 Drawing Sheets

Figure 3:
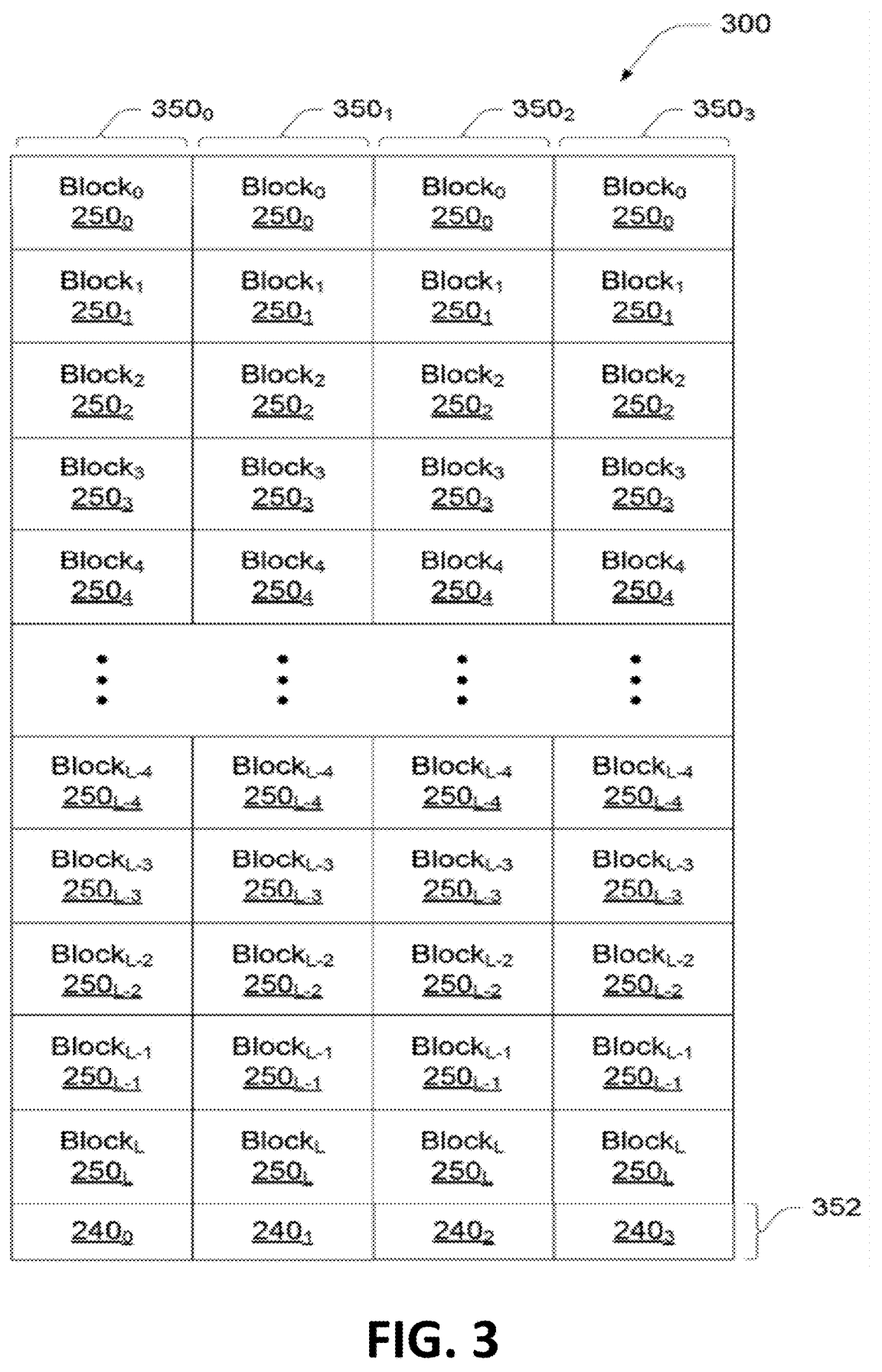

| $350_0$ | $350_1$ | $350_2$ | $350_3$ |
|---|---|---|---|
| $Block_0$ $250_0$ | $Block_0$ $250_0$ | $Block_0$ $250_0$ | $Block_0$ $250_0$ |
| $Block_1$ $250_1$ | $Block_1$ $250_1$ | $Block_1$ $250_1$ | $Block_1$ $250_1$ |
| $Block_2$ $250_2$ | $Block_2$ $250_2$ | $Block_2$ $250_2$ | $Block_2$ $250_2$ |
| $Block_3$ $250_3$ | $Block_3$ $250_3$ | $Block_3$ $250_3$ | $Block_3$ $250_3$ |
| $Block_4$ $250_4$ | $Block_4$ $250_4$ | $Block_4$ $250_4$ | $Block_4$ $250_4$ |
| ⋮ | ⋮ | ⋮ | ⋮ |
| $Block_{L-4}$ $250_{L-4}$ | $Block_{L-4}$ $250_{L-4}$ | $Block_{L-4}$ $250_{L-4}$ | $Block_{L-4}$ $250_{L-4}$ |
| $Block_{L-3}$ $250_{L-3}$ | $Block_{L-3}$ $250_{L-3}$ | $Block_{L-3}$ $250_{L-3}$ | $Block_{L-3}$ $250_{L-3}$ |
| $Block_{L-2}$ $250_{L-2}$ | $Block_{L-2}$ $250_{L-2}$ | $Block_{L-2}$ $250_{L-2}$ | $Block_{L-2}$ $250_{L-2}$ |
| $Block_{L-1}$ $250_{L-1}$ | $Block_{L-1}$ $250_{L-1}$ | $Block_{L-1}$ $250_{L-1}$ | $Block_{L-1}$ $250_{L-1}$ |
| $Block_L$ $250_L$ | $Block_L$ $250_L$ | $Block_L$ $250_L$ | $Block_L$ $250_L$ |
| $240_0$ | $240_1$ | $240_2$ | $240_3$ |

Voltage
Even Wordlines 400
Program Pulse 403
T1
T2
T3
Time
Erase pulse/erase verify cycle 1
Erase pulse
Erase verify
Erase pulse
Erase verify
Erase pulse
Erase verify
...
Voltage
Odd Wordlines 401
Program Pulse 403
T1
T2
T3
Time
Erase pulse/erase verify cycle 2
...

FIG. 5

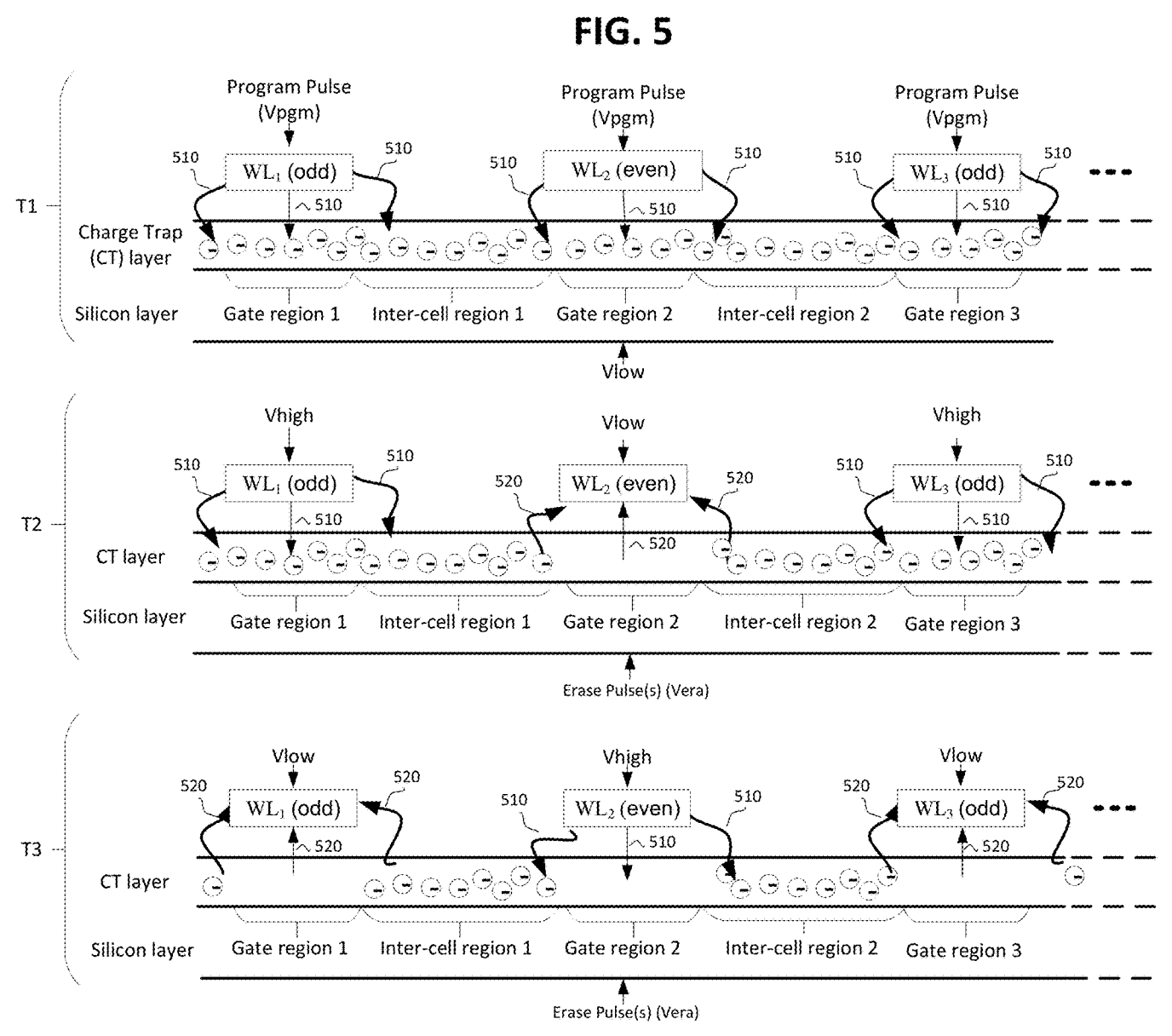

T1
Program Pulse (Vpgm)
$WL_1$ (odd)
$WL_2$ (even)
$WL_3$ (odd)
510
Charge Trap (CT) layer
Silicon layer
Gate region 1
Inter-cell region 1
Gate region 2
Inter-cell region 2
Gate region 3
Vlow T2
Vhigh
Vlow
Vhigh
510
520
CT layer
Silicon layer
Gate region 1
Inter-cell region 1
Gate region 2
Inter-cell region 2
Gate region 3
Erase Pulse(s) (Vera)

T3
Vlow
Vhigh
Vlow
510
520
CT layer
Silicon layer
Gate region 1
Inter-cell region 1
Gate region 2
Inter-cell region 2
Gate region 3
Erase Pulse(s) (Vera)

600

Cause a programming pulse to be applied to a set of wordlines including a first set of even-numbered wordlines corresponding to a first set of memory cells to be erased and a second set of odd-numbered wordlines corresponding to a second set of memory cells to be erased, where the programming pulse causes a set of electrons to be injected into a first set of gate regions, a second set of gate regions, and a set of inter-cell regions of a charge trap layer
610

Execute a first erase cycle on the first set of even-numbered wordlines to remove a first subset of electrons from the first set of gate regions corresponding to the first set of even-numbered wordlines
620

Execute a second erase cycle on the second set of odd-numbered wordlines to remove a second subset of electrons from the second set of gate regions corresponding to the second set of odd-numbered wordlines
630

FIG. 6

ERASE OPERATION WITH ELECTRON INJECTION FOR REDUCTION OF CELL-TO-CELL INTERFERENCE IN A MEMORY SUB-SYSTEM

CROSS-REFERENCE TO RELATED APPLICATIONS

This is a continuation of U.S. patent application Ser. No. 18/085,986, titled "Erase Operation with Electron Injection for Reduction of Cell-to-Cell Interference in a Memory Sub-System", filed Dec. 21, 2022, which in turn claims the benefit of U.S. Provisional Application No. 63/293,409, titled "Erase Operation with Electron Injection for Reduction of Cell-to-Cell Interference in a Memory Sub-System," filed Dec. 23, 2021. The entire disclosures of U.S. patent application Ser. No. 18/085,986 and U.S. Provisional Application No. 63/293,409 are hereby incorporated herein by reference.

TECHNICAL FIELD

Embodiments of the disclosure relate generally to memory sub-systems, and more specifically, relate to an erase operation with electron injection for reduction of cell-to-cell interference in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 2A-2C are schematics of portions of an array of memory cells as could be used in a memory of the type described with reference to FIG. 1B according to an embodiment.

FIG. 3 is a block schematic of a portion of an array of memory cells as could be used in a memory of the type described with reference to FIG. 1B according to an embodiment.

FIG. 5 illustrates an example multi-stage erase operation associated with a subset of even-numbered wordlines and a subset of odd-numbered wordlines of a memory device, in accordance with one or more embodiments.

FIG. 6 is a flow diagram of an example method of a multi-stage erase operation to erase a set of memory cells of a memory device in a memory sub-system, in accordance with one or more embodiments.

DETAILED DESCRIPTION

Figure 1A:
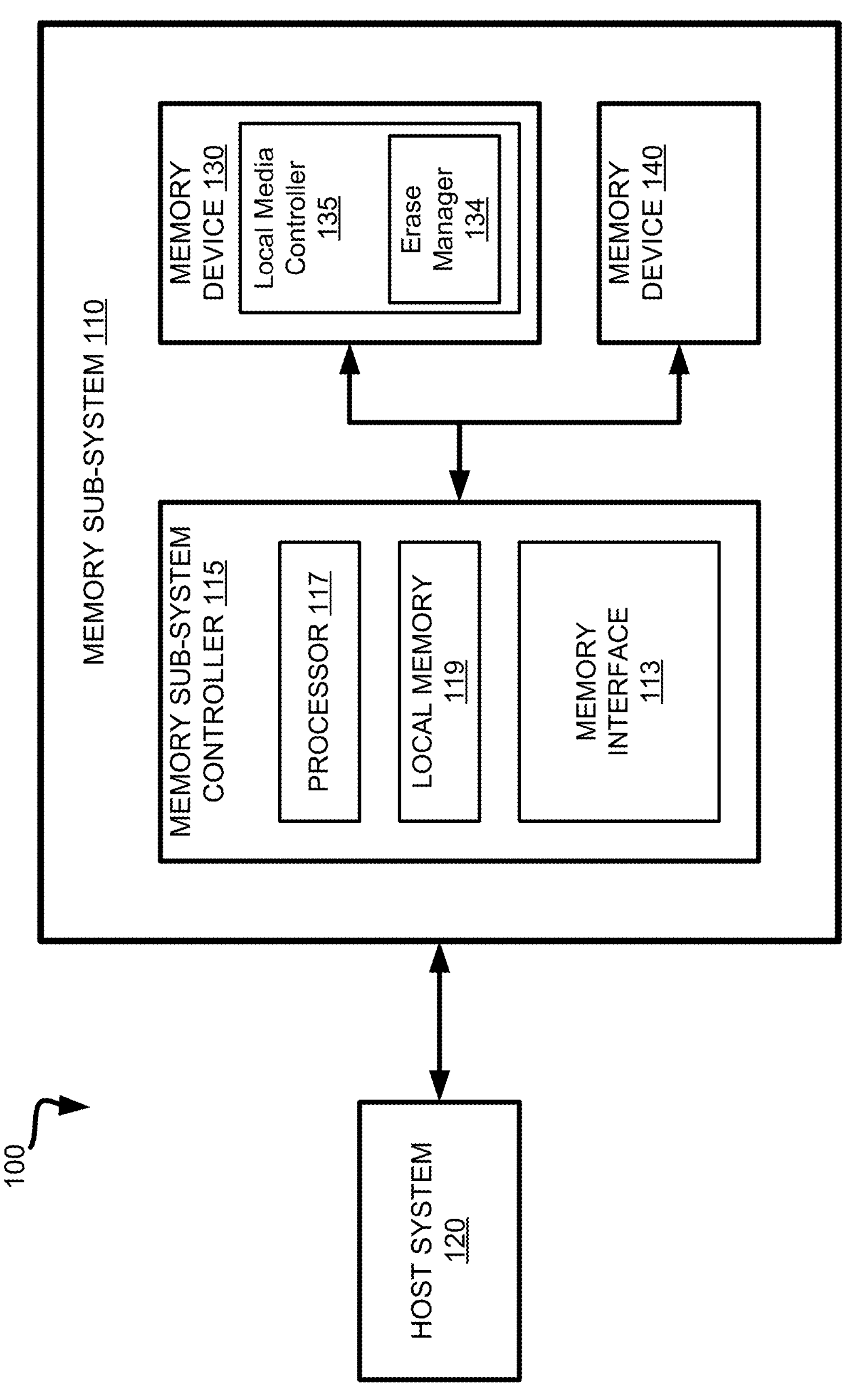
FIG. 1A illustrates an example computing system that includes a memory sub-system in accordance with some embodiments.

Aspects of the present disclosure are directed to programming of a memory device in a memory sub-system using an erase operation including alternating wordline erase sub-operations to inject electrons in inter-cell regions of a charge trap layer (e.g., a charge storage nitride film that is continuous throughout a pillar region of the memory device) to reduce cell-to-cell interference in a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information and has various logic states that correlate to the number of bits being stored. The logic states can be represented by binary values, such as "0" and "1", or combinations of such values.

Memory cells are formed onto a silicon wafer in an array of columns connected by conductive lines (also referred to as bitlines) and rows connected by conductive lines (also referred to as wordlines). A wordline can refer to a conductive line that connects control gates of a set (e.g., a row) of memory cells of a memory device that are used with one or more bitlines to generate the address of each of the memory cells. The intersection of a bitline and wordline constitutes the address of the memory cell.

A block hereinafter refers to a unit of the memory device used to store data and can include a group of memory cells, a wordline group, a wordline, or individual memory cells. Each block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines (i.e., wordlines) often fabricated in common with the memory cells, so as to form an array of strings in a block of memory (e.g., a memory array). The compact nature of certain non-volatile memory devices, such as 3D flash NAND memory, means wordlines are common to many memory cells within a block of memory. Some memory devices use certain types of memory cells, such as triple-level cell (TLC) memory cells, which store three bits of data in each memory cell, which make it affordable to move more applications from legacy hard disk drives to newer memory sub-systems, such as NAND solid-state drives (SSDs).

Memory access operations (e.g., a program operation, an erase operation, etc.) can be executed with respect to the memory cells by applying a wordline bias voltage to wordlines to which memory cells of a selected page are connected. For example, during a programming operation, one or more selected memory cells can be programmed with the application of a program voltage to a selected wordline. In one approach, an Incremental Step Pulse Programming (ISPP) process or scheme can be employed to maintain a tight cell threshold voltage distribution for higher data reliability. In ISPP, a series of high-amplitude pulses of voltage levels having an increasing magnitude (e.g., where the magnitude of subsequent pulses are increased by a predefined pulse step height) are applied to wordlines to which one or more memory cells are connected to gradually raise the voltage level of the memory cells to above a wordline voltage level corresponding to the memory access operation (e.g., a target program level). The application of the uniformly increasing pulses by a wordline driver of the memory device enables the selected wordline to be ramped or increased to a wordline voltage level ($V_{wl}$) corresponding to a memory access operation. Similarly, a series of voltage pulses having a uniformly increasing voltage level can be applied to the wordline to ramp the wordline to the corresponding wordline voltage level during the execution of an erase operation.

The series of incrementing voltage program pulses are applied to the selected wordline to increase a charge level, and thereby a threshold voltage (Vt), of each memory cell connected to that wordline. After each program pulse, or after a number of program pulses, a program verify operation is performed to determine if the threshold voltage of the one or more memory cells has increased to a desired programming level (e.g., a stored target threshold voltage corresponding to a programming level). A program verify operation can include storing a target threshold voltage in a page buffer that is coupled to each data line (e.g., bitline) and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare if the present threshold voltage is greater than or equal to the stored target threshold voltage. If the present threshold voltage is greater than or equal to the target threshold voltage, further programming is inhibited.

During programming, the sequence of program pulses can be incrementally increased in value (e.g., by a step voltage value such as 0.33V) to increase a charge stored on a charge storage structure corresponding to each pulse. The memory device can reach a target programming level voltage for a particular programming level by incrementally storing or increasing amounts of charge corresponding to the programming step voltage.

Certain memory devices include scaling of the distance between gates of adjacent memory cells (i.e., pillar pitch). However, pillar pitch scaling can result in an increase in cell-to-cell (C2C) interference where a threshold voltage shift of one floating gate transistor can influence the threshold voltage of one or more neighboring floating gate transistors through parasitic capacitance-coupling effect. The increase of C2C interference disadvantageously results in an expansion of the corresponding threshold voltage distributions in order to accommodate all possible threshold voltages for a given state and a reduction in the read window budget (RWB) corresponding to the programming distributions associated with the various programming levels. The RWB can refer to the cumulative value (e.g., in voltage) of a number (e.g., seven) of distances (e.g., measured in voltage) between adjacent threshold voltage distributions at a particular BER. In some typical systems, C2C interference due to pillar pitch scaling can result in approximately 650 mV loss of RWB margin.

C2C interference can be increased due to multiple causes including a fringing field effect and a parasitic charge effect. A fringing field effect is the capacitive coupling of electrons programmed underneath the gate confinement of an aggressor memory cell (i.e., a memory cell being programmed). A parasitic charge effect is due to the continuity of the charge storage nitride film or charge trap (CT) layer throughout the pillar, whereby electrons are programmed into one or more inter-cell regions of the CT layer between adjacent memory cells (e.g., an aggressor memory cell and one or more victim memory cells). For example, the parasitic charge effect occurs during programming of an aggressor memory cell through the creation of electric fields due to application of a pass voltage (Vpass) on a victim memory cell (i.e., a memory cell that is not being programmed) and a program voltage (Vpgm) on the aggressor memory cell. These parasitic charges make it difficult to turn on the inter-wordline region, thereby increasing the threshold voltage of the victim memory cell after programming an adjacent aggressor memory cell.

In the inter-cell region of the CT layer, parasitic charges are created near both the aggressor memory cell and the victim memory cell. However, because the parasitic charges near the victim memory cell are injected into the CT layer during the programming of the victim memory cell, only parasitic charges near the aggressor memory cell contribute to the increase of C2C interference. A program verify operation can be executed following each program pulse, so these parasitic charges do not contribute to an upper tail of the victim memory cell. However, the parasitic charges near the aggressor memory cell cause the injection of electrons into the CT layer after the victim memory cell finishes programming, and therefore contributes to the undesirable C2C interference.

According to aspects of the present disclosure, a multi-stage erase operation or algorithm is executed to reduce C2C interference among memory cells of a memory device. The multi-stage erase operation is part of a program/erase (P/E) cycle and includes sub-operations to erase a set of wordlines (e.g., $WL_1$, $WL_2$, $WL_3$ . . . WLn) corresponding to a memory block including memory cells identified for erasure prior to a subsequent programming operation of a next P/E cycle.

In a first stage, a program pulse is applied to the set of wordlines. Application of the program pulse to the wordlines causes electrons to be injected into the entire CT layer (e.g., the gate regions and the inter-cell regions). In a second stage, erase cycles (e.g., one or more erase pulses each followed by a corresponding erase verify operation) are executed with respect to alternating wordlines. During this stage, a first erase cycle is executed on a first subset of even-numbered wordlines to remove electrons from regions of the CT layer corresponding to the even-numbered wordlines (e.g., gate regions under gate confinement of the even-numbered wordlines). As a result of the first erase cycle, electrons remain in the inter-cell regions between the even-number wordlines and the odd-numbered wordlines. In an embodiment, a second erase cycle is executed on a second subset of odd-numbered wordlines to remove electrons from regions of the CT layer corresponding to the odd-numbered wordlines (e.g., gate regions under gate confinement of the odd-numbered wordlines). As a result of the second erase cycle, electrons continue to occupy the inter-cell regions between the even-number wordlines and the odd-numbered wordlines, while the electrons in the gate regions are removed. Advantageously, the electron-occupied inter-cell regions of the CT layer shield electric fields caused by the application of a pass voltage (Vpass) and a program voltage (Vpgm) applied during a subsequent programming operation. The multi-stage erase operation reduces an amount or number of electrons that can be further programmed into the inter-cell regions, thereby reducing the level of C2C interference.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes an erase manager 134 configured to carry out corresponding memory access operations, in response to receiving the memory access commands from memory interface 113. In some embodiments, local media controller 135 includes at least a portion of erase manager 134 and is configured to perform the functionality described herein. In some embodiments, erase manager 134 is implemented on memory device 130 using firmware, hardware components, or a combination of the above. In one embodiment, erase manager 134 receives, from a requestor, such as memory interface 113, a request to erase data associated with one or more memory blocks including memory cells of a memory array of memory device 130. In an embodiment, the erase manager 134 may receive a request to initiate a programming operation of a P/E cycle with respect to a set of target memory cells. In response, the erase manager 134 can execute an erase operation in accordance with the present disclosure to erase the target memory cells prior to the programming operation. The memory array can include an array of memory cells formed at the intersections of wordlines and bitlines. In one embodiment, the memory cells are grouped into blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of 8 programming distributions representing the eight (8) different combinations of the three bits stored in each memory cell. Depending on how the memory cells are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In one embodiment, erase manager 134 can execute a multi-stage erase operation including a first stage including causing application of a program pulse to a set of wordlines associated with target memory cells to be erased (e.g., all wordlines including a first subset of even-numbered wordlines and a second set of odd-numbered wordlines). In the first stage, application of the programing pulse causes electrons to be injected into and occupy a CT layer corresponding to the set of wordlines (e.g., occupy both the gate regions and the inter-cell regions of the CT layer). In an embodiment, the program pulse can have a high voltage level (Vpgm) in a range of approximately 20V or higher to create electric fields at the inter-cell regions of the CT layer that are similar to those created in response to a final or last program pulse of a typical programming operation. In an embodiment, the erase manager 134 executes the multi-stage erase operation as part of a first P/E cycle to erase the target memory cells prior to the execution of a programming operation of a next or subsequent P/E cycle.

In an embodiment, the erase manager 134 performs a second stage of the multi-stage erase operation including execution of erase cycles on alternating sets of wordlines. In an embodiment, the erase manager 134 executes a first erase cycle on a first subset of even-numbered wordlines to erase the even-numbered wordlines. Execution of the first erase cycle causes a removal of the electrons from the gate regions of the CT layer that correspond to the even-number wordlines. Following the first erase cycle (e.g., after verifying the even-numbered wordlines are erased), the erase manager 134 executes a second erase cycle with respect to the odd-numbered wordlines. The second erase cycle removes or extracts the electrons occupying the gate regions of the CT layer that correspond to the odd-numbered wordlines. As a result of the second stage (i.e., the execution of the first erase cycle on the even-numbered wordlines and the second erase cycle on the odd-numbered wordlines), electrons remain in only the inter-cell regions (e.g., the regions of the CT layer between the memory cells of the even-numbered wordlines and the odd-numbered wordlines). Advantageously, occupation of the inter-cell regions by electrons causes an electric field line from adjacent gates of neighboring wordlines (e.g., $WL_1$ and $WL_2$) that are oriented in opposite directions at the inter-cell regions. This reduces the overall electric fields in those regions and minimizes a number of electrons that are erased from the inter-cell region.

In an embodiment, a next programming operation with respect to the erased memory cells can be performed, where an amount of additional electrons that can be injected into the electron-occupied inter-cell regions during the next programming operation is reduced. The reduction of injected electrons results in a decrease in C2C interference associated with the next programming operation.

Figure 1B:
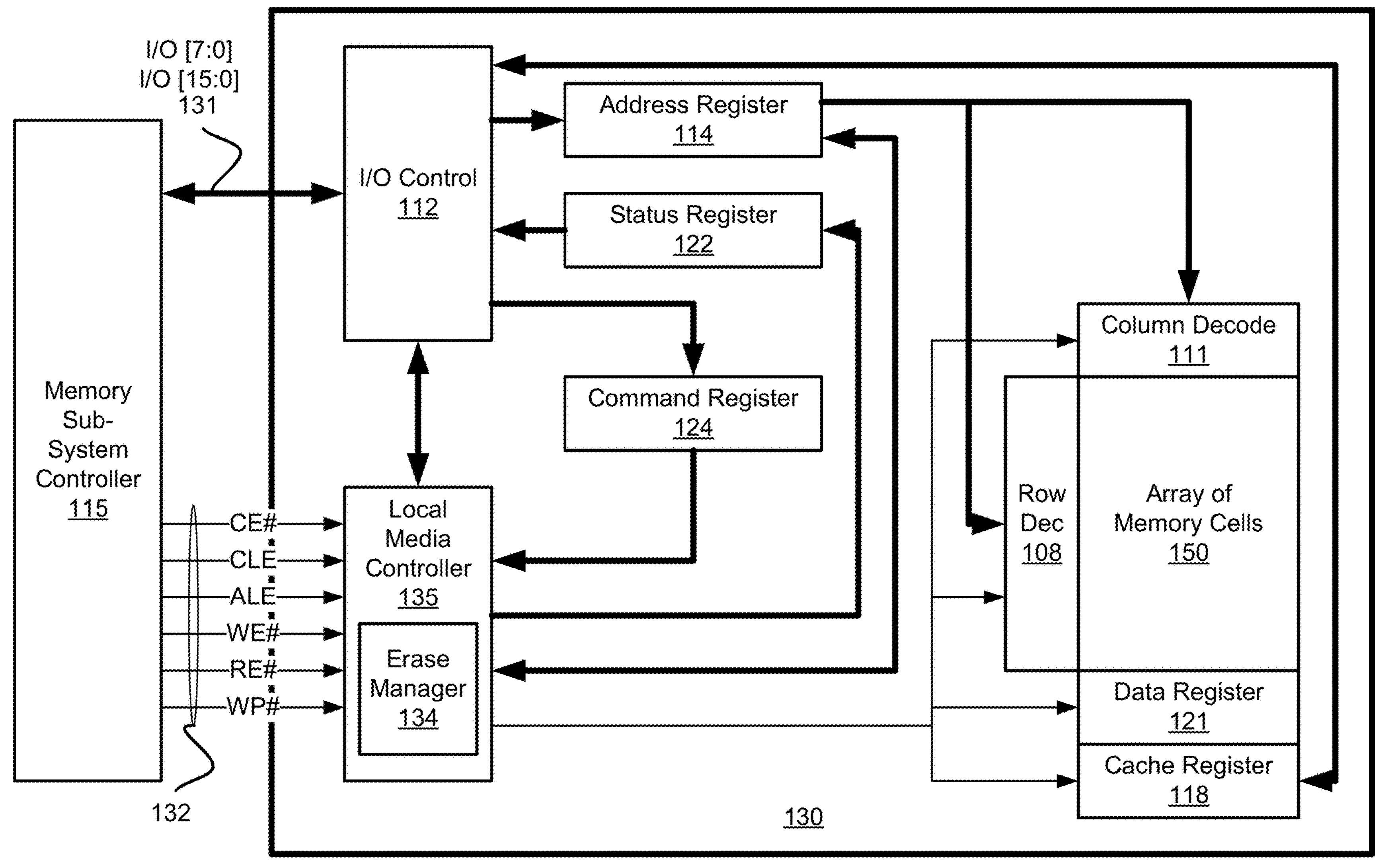
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 150 are capable of being programmed to one of at least two target data states.

Row decode circuitry 108 and column decode circuitry 111 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 111 to control the row decode circuitry 108 and column decode circuitry 111 in response to the addresses. In one embodiment, local media controller 135 includes erase manager 134, which can implement the multi-stage erase operation including execution of erase cycles of alternating sets of wordlines (e.g., a first subset of even-numbered wordlines and a second set of odd-numbered wordlines) to reduce C2C interference associated with a subsequent programming operation of memory device 130, as described herein.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 121 for transfer to the array of memory cells 150; then new data may be latched in the cache register 118 from the I/O control circuitry 112. During a read operation, data may be passed from the cache register 118 to the I/O control circuitry 112 for output to the memory sub-system controller 115; then new data may be passed from the data register 121 to the cache register 118. The cache register 118 and/or the data register 121 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 131 and outputs data to the memory sub-system controller 115 over I/O bus 131.

For example, the commands may be received over input/output (I/O) pins [7:0] of I/O bus 131 at I/O control circuitry 112 and may then be written into command register 124. The addresses may be received over input/output (I/O) pins [7:0] of I/O bus 234 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 121 for programming the array of memory cells 150.

In an embodiment, cache register 118 may be omitted, and the data may be written directly into data register 121. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
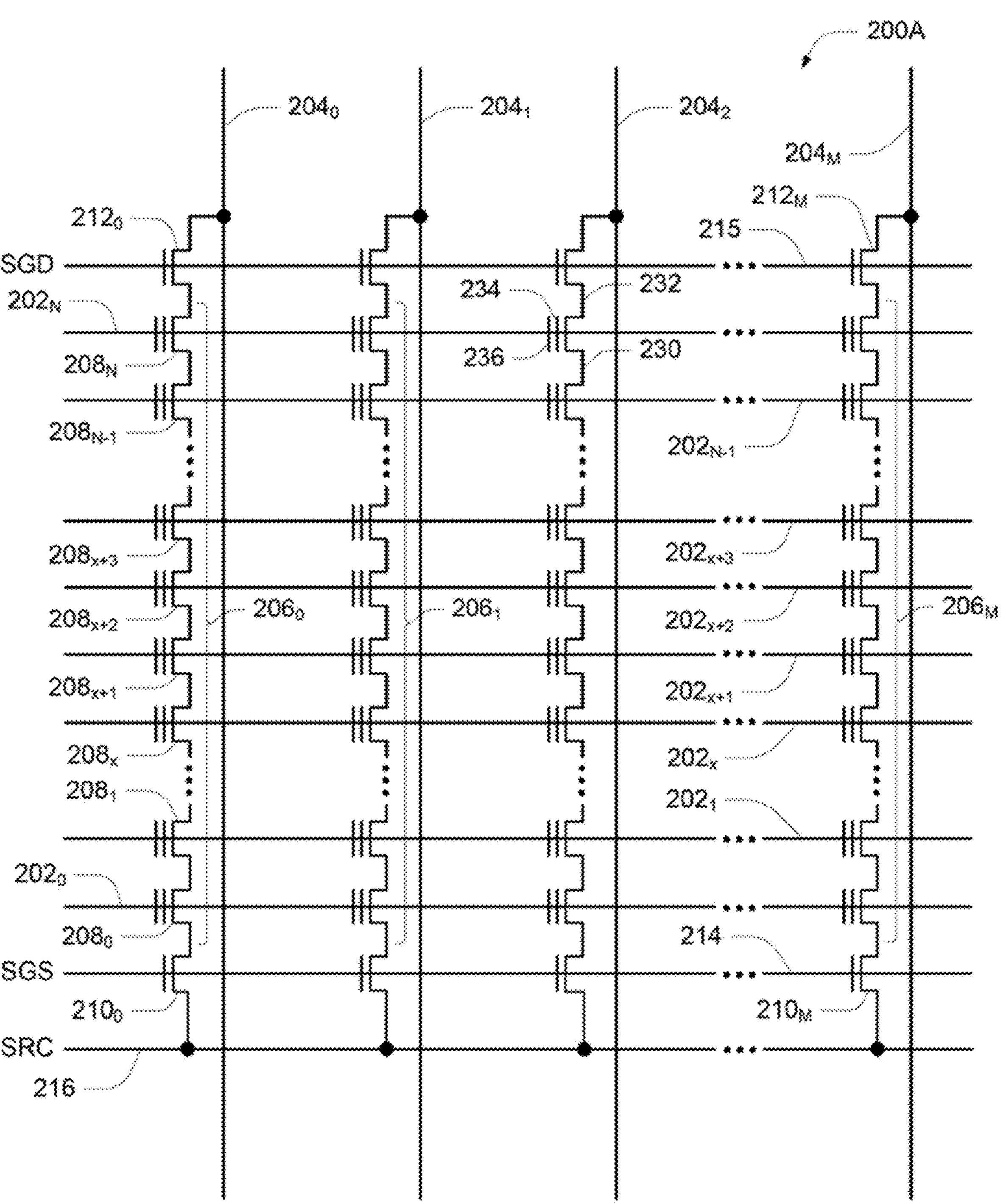
Figure 2B:
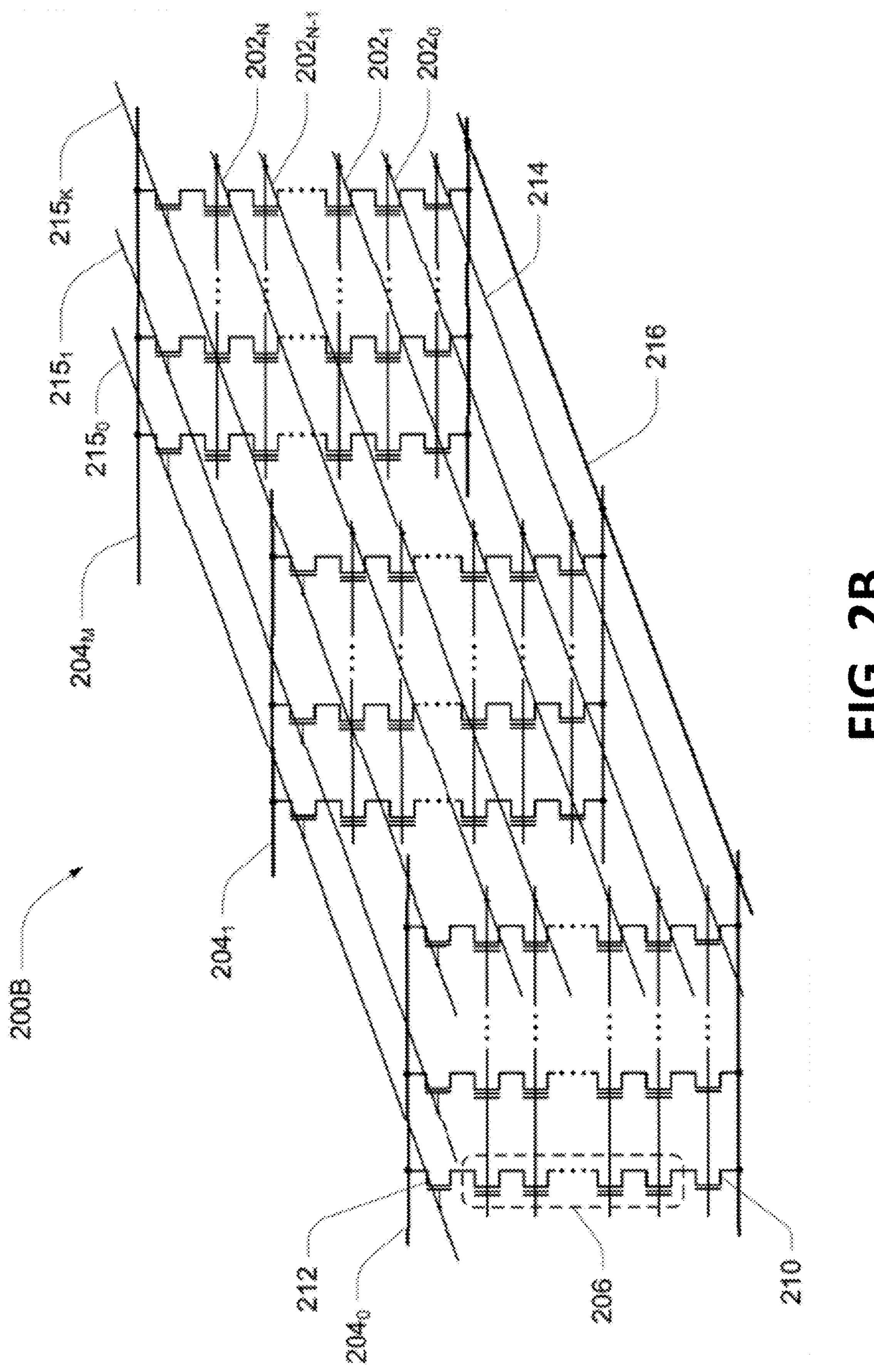
Figure 2C:
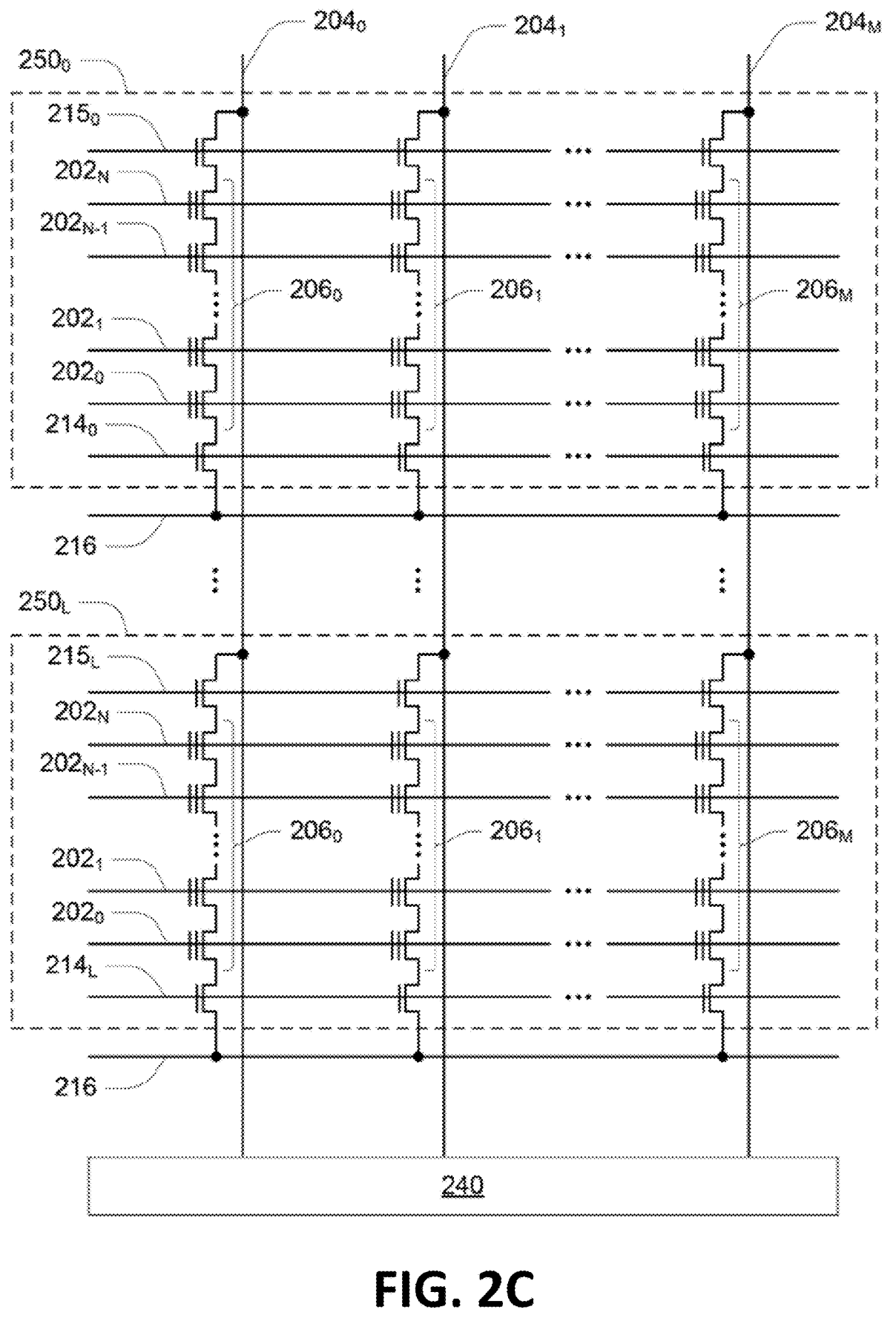

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $\mathbf{202}_0$ to $\mathbf{202}_N$, and data lines, such as bitlines $\mathbf{204}_0$ to $\mathbf{204}_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $\mathbf{206}_0$ to $\mathbf{206}_M$. Each NAND string 206 can be connected (e.g., selectively connected) to a common source (SRC) 216 and can include memory cells $\mathbf{208}_0$ to $\mathbf{208}_N$. The memory cells 208 can represent non-volatile memory cells for storage of data. The memory cells 208 of each NAND string 206 can be connected in series between a select gate 210 (e.g., a field-effect transistor), such as one of the select gates $\mathbf{210}_0$ to $\mathbf{210}_M$ (e.g., that can be source select transistors, commonly referred to as select gate source), and a select gate 212 (e.g., a field-effect transistor), such as one of the select gates $\mathbf{212}_0$ to $\mathbf{212}_M$ (e.g., that can be drain select transistors, commonly referred to as select gate drain). Select gates $\mathbf{210}_0$ to $\mathbf{210}_M$ can be commonly connected to a select line 214, such as a source select line (SGS), and select gates $\mathbf{212}_0$ to $\mathbf{212}_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $\mathbf{208}_0$ of the corresponding NAND string 206. For example, the drain of select gate $\mathbf{210}_0$ can be connected to memory cell $\mathbf{208}_0$ of the corresponding NAND string $\mathbf{206}_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $\mathbf{212}_0$ can be connected to the bitline $\mathbf{204}_0$ for the corresponding NAND string $\mathbf{206}_0$. The source of each select gate 212 can be connected to a memory cell $\mathbf{208}_N$ of the corresponding NAND string 206. For example, the source of select gate $\mathbf{212}_0$ can be connected to memory cell $\mathbf{208}_N$ of the corresponding NAND string $\mathbf{206}_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap layer, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $\mathbf{202}_N$ and selectively connected to even bitlines 204 (e.g., bitlines $\mathbf{204}_0$, $\mathbf{204}_2$, $\mathbf{204}_4$, etc.) can be one physical page of the memory cells 208 (e.g., even memory cells) while memory cells 208 commonly connected to wordline $\mathbf{202}_N$ and selectively connected to odd bitlines 204 (e.g., bitlines $\mathbf{204}_1$, $\mathbf{204}_3$, $\mathbf{204}_5$, etc.) can be another physical page of the memory cells 208 (e.g., odd memory cells).

Although bitlines $\mathbf{204}_3$-$\mathbf{204}_5$ are not explicitly depicted in FIG. 2A, it is apparent from the figure that the bitlines 204 of the array of memory cells 200A can be numbered consecutively from bitline $\mathbf{204}_0$ to bitline $\mathbf{204}_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $\mathbf{202}_0$-$\mathbf{202}_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $\mathbf{204}_0$-$\mathbf{204}_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $\mathbf{215}_0$-$\mathbf{215}_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $\mathbf{250}_0$-$\mathbf{250}_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $\mathbf{215}_0$. The source 216 for the block of memory cells $\mathbf{250}_0$ can be a same source as the source 216 for the block of memory cells $\mathbf{250}_L$. For example, each block of memory cells $\mathbf{250}_0$-$\mathbf{250}_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $\mathbf{250}_0$-$\mathbf{250}_L$.

The bitlines $\mathbf{204}_0$-$\mathbf{204}_M$ can be connected (e.g., selectively connected) to a buffer portion 240, which can be a portion of the page buffer 152 of the memory device 130. The buffer portion 240 can correspond to a memory plane (e.g., the set of blocks of memory cells $\mathbf{250}_0$-$\mathbf{250}_L$). The buffer portion 240 can include sense circuits (which can include sense amplifiers) for sensing data values indicated on respective bitlines 204.

FIG. 3 is a block schematic of a portion of an array of memory cells 300 as could be used in a memory of the type described with reference to FIG. 1B. The array of memory cells 300 is depicted as having four memory planes 350 (e.g., memory planes $\mathbf{350_0}$-$\mathbf{350_3}$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $\mathbf{250_0}$-$\mathbf{250_L}$).

Figure 4:
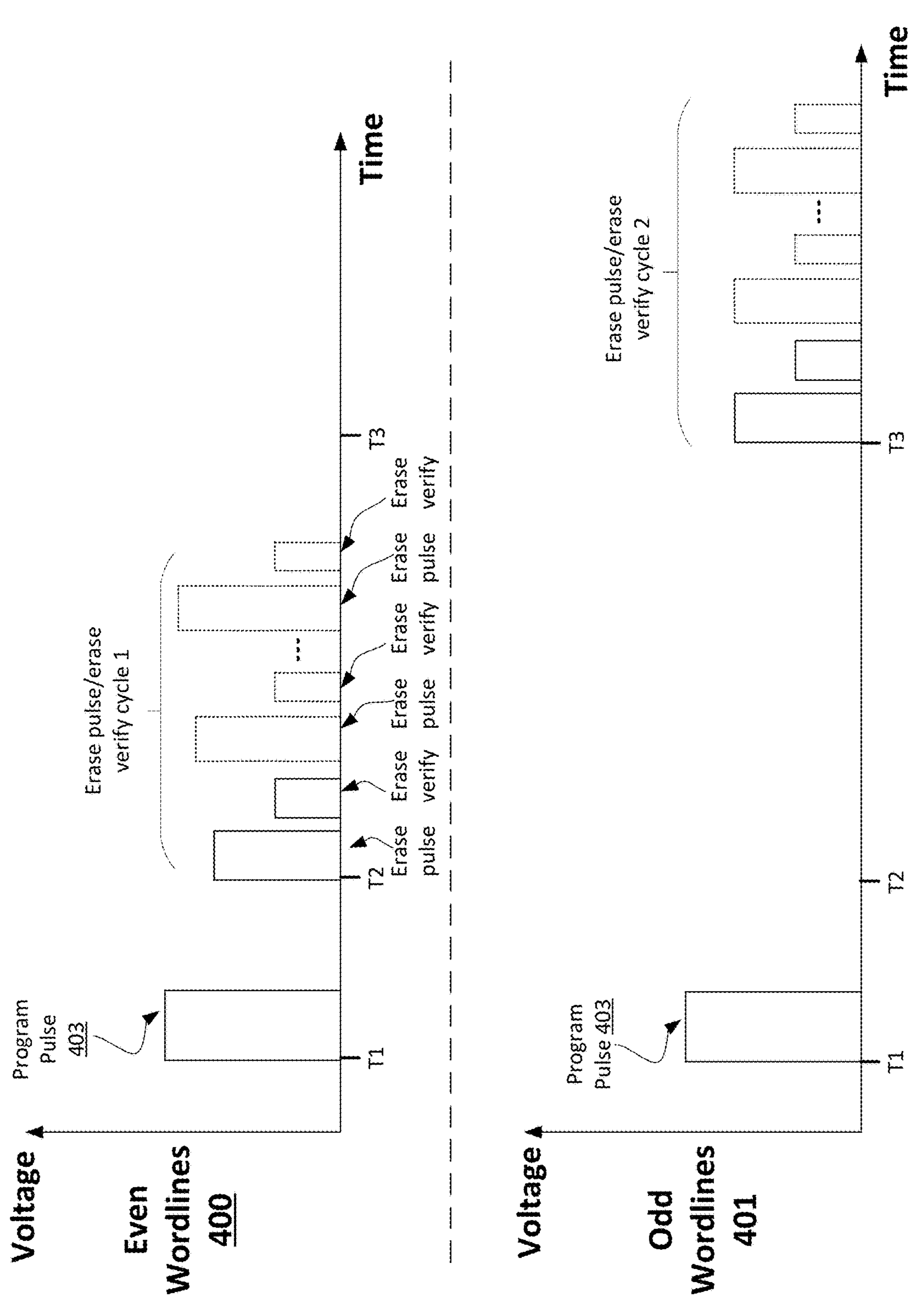
FIG. 4 is an example timeline corresponding to execution of an example multi-stage erase operation erase memory block including target memory cells corresponding to a set of wordlines a memory device, in accordance with one or more embodiments of the present disclosure.

FIG. 4 is an example timeline corresponding to execution of an example multi-stage erase operation to erase memory block including target memory cells corresponding to a set of wordlines a memory device, in accordance with one or more embodiments of the present disclosure. As shown in FIG. 4, the multi-stage erase operation is executed to erase a set of memory cells corresponding to a set of wordlines (e.g., $WL_1$, $WL_2$, $WL_3$, $WL_4$ . . . WLn, where n is an even number) including a first subset of even-numbered wordlines 400 and a second set of odd-numbered wordlines 401 arranged adjacent to one another along a continuous CT layer. At a first time (T1), a first stage of the multi-stage erase operation is performed. In an embodiment, the first set of wordlines 400 (e.g., $WL_2$, $WL_4$, $WL_6$ . . . $WL_n$) and the second set of wordlines 401 (e.g., $WL_1$, $WL_3$, $WL_5$ . . . $WL_{N-1}$) are arranged in an alternating configuration (e.g., a sequence of adjacent or neighboring wordlines such as $WL_1$, $WL_2$ adjacent to $WL_3$ adjacent to $WL_4$, and so on).

As shown in FIG. 4, in the first stage, at time T1, a program pulse 403 is caused to be applied to the set of wordlines including both the first subset of even-numbered wordlines and the second subset of odd-numbered wordlines associated with memory cells that are to be erased. In an embodiment, the program pulse 403 (also referred to as a pre-program pulse) has a program voltage level (Vpgm) in a range of approximately 20V or higher. In an embodiment, the Vpgm of approximately 20V or higher is a relatively high voltage level as compared to conventional pre-program pulses (e.g., used to prevent over-erase of erased memory cells), which are typically around 12V.

In an embodiment, the program pulse has a program voltage (e.g. approximately 20V or higher) that is comparable to the program voltage of a final program pulse of a programming operation. In an embodiment, the single program pulse having a Vpgm of 20V or higher that is applied during the first stage of the multi-stage erase operation creates an electric field at the inter-cell regions of the CT layer that is similar the electric field generated during execution of a programming operation. In an embodiment, the large electric field caused by the program pulse 403 attract electrons into the CT layer to occupy the CT layer with a high density. In an embodiment, a single program pulse 403 is applied during this stage, without a corresponding program verify operation. In an embodiment, as a result of the application of the program pulse 403 to the entire set of wordlines at time T1 causes electrons to occupy the entire CT layer including the gate regions underneath the gates of all of the wordlines and the inter-cell regions between the adjacent wordlines.

As shown in FIG. 4, at time T2, in a second stage of the multi-stage erase operation, a first erase cycle is executed on the subset of even wordlines 400 (e.g., $WL_2$, $WL_4$, $WL_6$, and so). In an embodiment, the first erase cycle can include one or more erase pulses having an erase voltage level (Vera) and one or more corresponding erase verify operations. In an embodiment, the one or more erase pulses can be applied with an incrementally increasing Vera level. For example, a first erase pulse of the first erase cycle can have a $Vera_1$ of approximately 17V, a second erase pulse (if applied) can have a $Vera_2$ of approximately 17.25V, a third erase pulse (if applied) can have a $Vera_3$ of approximately 17.50V, and so on. In an embodiment, the one or more erase pulses of the first erase cycle executed to erase the memory cells associated with the subset of even-numbered wordlines at a Vera in a range of approximately 17V to 20V (e.g., applied to a silicon layer associated with the memory cells to be erased) while a ground voltage level (e.g., approximately 0V) is applied to the one or more wordlines of the subset of even-numbered wordlines associated with the memory cells to be erased. In an embodiment, during execution of the first erase cycle on the subset of even-numbered wordlines, a high voltage level (Vhigh) is applied to the subset of odd-numbered wordlines (e.g., to prevent the memory cells associated with the subset of odd-numbered wordlines from being erased). According to embodiments, Vhigh is greater than or equal to Vera (e.g., Vhigh is in a range of approximately 17V to 21V).

In an embodiment, at the completion of the first erase cycle, the memory cells associated with the subset of even-numbered wordlines are erased and the electrons located in the gate regions corresponding to the even-numbered wordlines are removed, as described in greater detail below with reference to FIG. 5.

As shown in FIG. 4, at time T3 (following completion of the first erase cycle), a second erase cycle is executed is on the subset of odd wordlines 401 (e.g., $WL_1$, $WL_3$, $WL_5$, and so). In an embodiment, like the first erase cycle, the second erase cycle can include one or more erase pulses having an erase voltage level (Vera) and one or more corresponding erase verify operations. In an embodiment, the Vera of the erase pulse(s) can be in a range of approximately 17V to 20V. In an embodiment, a single erase pulse and erase verify pulse may be applied in the second erase cycle (i.e., optional additional erase pulses and erase verify pulses are denoted with dashed lines in FIG. 4).

In an embodiment, the one or more erase pulses of the second erase cycle executed to erase the memory cells associated with the subset of odd-numbered wordlines include applying the erase pulse to a silicon layer associated with the memory cells to be erased while a ground voltage level (e.g., approximately 0V) is applied to the one or more wordlines of the subset of odd-numbered wordlines associated with the memory cells to be erased. In an embodiment, during execution of the second erase cycle on the subset of odd-numbered wordlines, a high voltage level (Vhigh) is applied to the subset of odd-numbered wordlines (e.g., to prevent the memory cells associated with the subset of odd-numbered wordlines from being erased). In an embodiment, at the completion of the first erase cycle, the memory cells associated with the subset of even-numbered wordlines are erased and the electrons located in the gate regions corresponding to the odd-numbered wordlines are removed, as described in greater detail below with reference to FIG. 5.

Although shown and described with the first erase cycle executed on the subset of even-numbered wordlines and the second erase cycle executed on the subset of odd-numbered wordlines, in another embodiment, the first erase cycle can be executed to erase the memory cells associated with the odd-numbered wordlines followed by the second erase cycle being executed to erase the memory cells associated with the even-numbered wordlines.

According to embodiments, completion of the multi-stage erase operation (i.e., following completion of the second erase cycle) results in the removal of the electrons located in the gate regions of the CT layer corresponding to both the even-numbered wordlines and the odd-numbered wordlines. Accordingly, the multi-stage erase operation generates electron occupation of the inter-cell regions of the CT layer, to reduce the level of C2C interference associated with a subsequent programming operation of the memory cells associated with the set of wordlines.

FIG. 5 illustrates an example multi-stage erase operation associated with a subset of even-numbered wordlines and a subset of odd-numbered wordlines of a memory device, in accordance with one or more embodiments. In the example shown, a portion of the set of wordlines including a first odd-numbered wordline ($WL_1$) adjacent to a first even-numbered wordline ($WL_2$) adjacent to a second odd-numbered wordline ($WL_3$). As shown at a first time T1, a program pulse having a program voltage level (Vpgm) is applied to the entire set of wordlines including the illustrated $WL_1$, $WL_2$, and $WL_3$. In an embodiment, Vpgm is in a range of approximately 20V or higher. As a result of the application of the program pulse, electrons are injected into the gate regions (e.g., gate region 1, gate region 2, and gate region 3) and the inter-cell regions (e.g., inter-cell region 1, inter-cell region 2, and inter-cell region 3). As shown in FIG. 5, during application of the program pulse to the wordlines, the silicon layer has low voltage level (Vlow) (e.g., a ground voltage level of approximately 0V). As shown in FIG. 5, electric field lines 510 associated with the program pulse are directed toward the CT layer, thereby causing the electrons to occupy the entire CT layer following completion of the program pulse at time T1

With reference to FIG. 5, at time T2, a first erase cycle is executed on the even-numbered wordlines (e.g., $WL_2$ in the example shown) to erase the memory cells corresponding to the even-numbered wordlines. In an embodiment, one or more erase pulses having an erase voltage level (Vera) are applied to the silicon layer and a low voltage (Vlow) is applied to the even-numbered wordlines. In an embodiment, Vlow can be a ground voltage level of approximately 0V. In an embodiment, a high voltage (Vhigh) is applied to the odd-numbered wordlines (e.g., $WL_1$ and $WL_3$) that are not being erased. In an embodiment, Vhigh is greater than or equal to Vera (e.g., Vhigh is in a range of approximately 17V to 21V).

As shown, electric field lines 520 associated with the first erase cycle executed on the even-numbered wordlines are in a direction away from the CT layer and toward the even-numbered wordlines (e.g., toward $WL_2$). This results in the electrons that previously occupied gate region 2 to be removed. Electric field lines associated with the programming 510 remain directed to the CT layer in view of the high voltage (Vhigh) being applied to the wordlines of the odd-numbered wordlines. In an embodiment, the electric field lines from two adjacent gates (e.g., electric field lines 510 from the gate of $WL_1$ and electric field line 520 from the gate of $WL_2$) are in opposite directions at the inter-cell regions (e.g., inter-cell region 1), which reduces the overall electric fields and minimizes the number of electrons being erased from the inter-cell regions.

At time T3, a second erase cycle is executed on the odd-numbered wordlines (e.g., $WL_1$ and $WL_3$ in the example shown) to erase the memory cells corresponding to the odd-numbered wordlines. In an embodiment, one or more erase pulses having an erase voltage level (Vera) are applied to the silicon layer and Vlow (e.g., a ground voltage level of approximately 0V) is applied to the odd-numbered wordlines. As shown, Vhigh is applied to the even-numbered wordlines (e.g., $WL_2$ in FIG. 5) to prevent over-erasing of those memory cells.

As shown in FIG. 5, as a result of the electric field lines 520 corresponding to the second erase cycle directed away from the CT layer, the electrons corresponding to the gate regions (e.g., gate region 1 and gate region 3) of the odd-numbered wordlines are removed. Accordingly, following completion of the second erase cycle executed at time T3, the inter-cell regions of the CT layer are occupied by electrons, while the In an embodiment, Vhigh is greater than or equal to Vera (e.g., Vhigh is in a range of approximately 17V to 21V).

As described above, the electric field lines from two adjacent gates (e.g., electric field lines 510 from the gate of $WL_2$ and electric field line 520 from the gate of $WL_1$) are in opposite directions at the inter-cell regions (e.g., inter-cell region 1), which reduces the overall electric fields and minimizes the number of electrons erased or removed from the inter-cell regions. Advantageously, as shown in FIG. 5, electrons are caused to occupy the inter-cell regions (e.g., inter-cell region 1 and inter-cell region 2) following the erase cycle at time T3. Accordingly, the memory cells associated with the set of wordlines (e.g., $WL_1$, $WL_2$, and $WL_3$ in the example shown in FIG. 5) are prepared prior to a subsequent programming operation in view of the occupation by electrons in the inter-cell regions between any two adjacent wordlines. The occupation of the electrons in the inter-cell regions reduces a number of electrons that can be programmed into the inter-cell regions during a subsequent programming operation. This reduction of electrons that can be injected into the inter-cell regions during the subsequent programming operation reduces the level of C2C interference due to over-programming. Advantageously, occupation of the inter-cell regions with electrons prior to a subsequent programming operation of a next P/E cycle establishes a shield for the electric field, thereby reducing the electrons that cause C2C interference in a typical program operation.

FIG. 6 is a flow diagram of an example method 600 of a multi-stage erase operation to erase memory cells associated with a set of wordlines of a memory device in a memory sub-system in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by erase manager 134 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a pulse is caused to be applied. For example, processing logic (e.g., erase manager 134) causes a program pulse to be applied to a first subset of even-numbered wordlines of a memory device corresponding to a first set of memory cells to be erased and a second set of odd-numbered wordlines corresponding to a second set of memory cells to be erased and a second subset of odd-numbered wordlines, where the programming pulse causes a set of electrons to be injected into a first set of gate regions, a second set of gate regions, and a set of inter-cell regions of a charge trap layer. In an embodiment, the program pulse has a program voltage level (Vpgm) that is in a range of approximately 20V or higher. In an embodiment, application of the program pulse to both the first subset of even-numbered wordlines and the second subset of odd-numbered wordlines causes electrons to be injected into the gate regions and inter-cell regions of the CT layer (e.g., a charge storage nitride film that is continuous throughout the corresponding pillar regions) corresponding to the set of wordlines. In an embodiment, operation 610 can be performed in response to a command to condition and erase the first set of memory cells and the second set of memory cells prior to execution of a subsequent programming operation.

At operation 620, a first erase cycle is performed. For example, the processing logic can execute a first erase cycle on the first set of even-numbered wordlines to remove a first subset of electrons from the first set of gate regions corresponding to the first set of even-numbered wordlines. In an embodiment, the first erase cycle includes one or more erase pulses having an erase voltage (Vera) and one or more corresponding erase verify operations. In an embodiment, a first erase pulse of the first erase cycle can have a first erase voltage ($Vera_1$). In an embodiment, $Vera_1$ can be in a range of approximately 17V to 21V. The first erase pulse can be applied to erase the memory cells associated with the even-numbered wordlines. In an embodiment, the first erase pulse can be applied to a silicon layer while a low voltage level, Vlow (e.g., a ground voltage level of approximately 0V), is applied to the even-numbered wordlines.

During the second erase cycle, the high voltage level (Vhigh) is applied to the first set of odd-numbered wordlines to prevent over-erasing of the first set of memory cells associated with the even-numbered wordlines. In an embodiment, Vhigh is greater than or equal to Vera. For example, Vhigh can be in a range of approximately 17V to 21V, provided that Vhigh is greater than the Vera of the erase pulse that is being applied. According to embodiments, the first erase cycle can include one or more additional for further erase pulses having an incrementally increasing erase voltage level (e.g., $Vera_2$, $Vera_3$, and so on; where $Vera_2$ is greater than $Vera_1$, $Vera_3$ is greater than $Vera_2$, and so on). In an embodiment, each of the one or more erase pulses is followed by an erase verify operation to verify the threshold voltage of the first set of memory cells being erased has reached a target erase level.

At operation 630, a second erase cycle is performed. For example, the processing logic can execute a second erase cycle on the second set of odd-numbered wordlines to remove a second subset of electrons from the second set of gate regions corresponding to the second set of odd-numbered wordlines. In an embodiment, the second erase cycle includes one or more erase pulses having an erase voltage (Vera) and one or more corresponding erase verify operations. The one or more erase pulses of the second erase cycle are applied to erase the second set of memory cells associated with the odd-numbered wordlines. In an embodiment, the one or more erase pulses can be applied to a silicon layer while a low voltage level, Vlow (e.g., a ground voltage level of approximately 0V), is applied to the odd-numbered wordlines.

During the second erase cycle, the high voltage level (Vhigh), which is higher than the Vera of the one or more erase pulse, is applied to the first set of even-numbered wordlines to prevent over-erasing of the first set of memory cells associated with the even-numbered wordlines. According to embodiments, the second erase cycle can include one or more additional for further erase pulses having an incrementally increasing erase voltage level (e.g., Vera2, Vera3, and so on; where Vera2 is greater than Vera1, Vera3 is greater than Vera2, and so on). In an embodiment, each of the one or more erase pulses is followed by an erase verify operation to verify the threshold voltage of the second set of memory cells being erased has reached a target erase level.

In an embodiment, as a result of the second erase cycle and the erasing of the second set of memory cells corresponding to the second set of odd-numbered wordlines, electrons are removed from each gate region of the CT layer corresponding to the odd-numbered wordlines. Following the first erase cycle (operation 620) and the second erase cycle (operation 630), electrons injected into the CT layer as a result of operation 610 continue to occupy the inter-cell regions of the CT layer. In this regard, the electrons that once occupied the gate regions due to the programming pulse are now removed from those gate regions (as shown in FIG. 5). Advantageously, the inter-cell regions of the CT layer remain occupied by electrons following operation 630 to reduce C2C interference associated with a subsequent programming operation relating to those memory cells.

Figure 7:
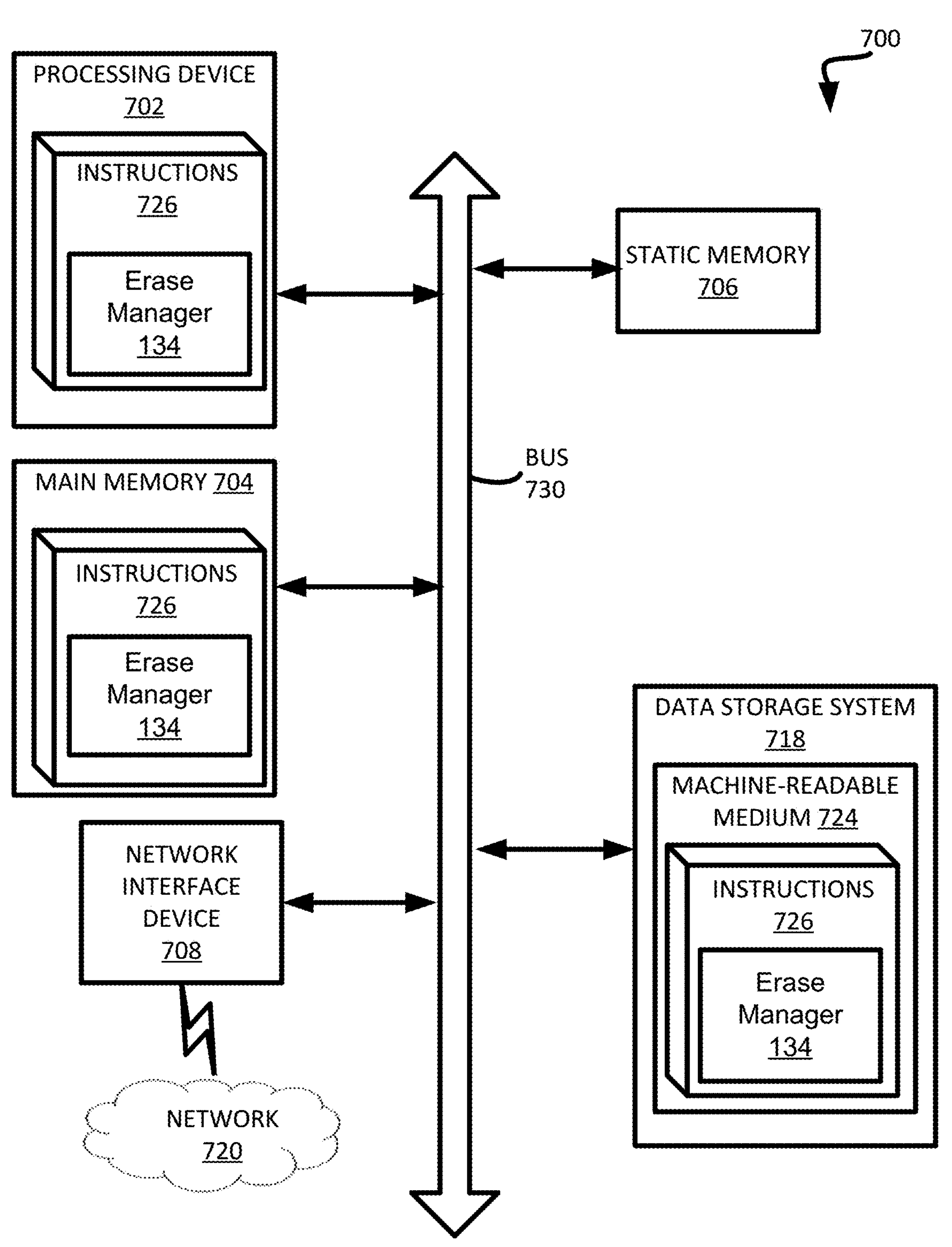
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to erase manager 134 of FIGS. 1A and 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium, such as a non-transitory computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIGS. 1A and 1B.

In one embodiment, the instructions 726 include instructions to implement functionality corresponding to erase manager 134 of FIGS. 1A and 1B). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

a memory array comprising a set of memory cells; and control logic, operatively coupled with the memory array, to perform operations comprising:

causing, during execution of an erase operation to erase a memory block associated with a set of wordlines, a programming pulse to be applied to the set of wordlines, wherein the programming pulse causes a set of electrons to be injected into a first set of gate regions and a second set of gate regions;

executing, during the erase operation, a first erase sub-operation on a first subset of the set of wordlines to remove a first subset of the set of electrons from the first set of gate regions; and executing, during the erase operation, a second erase sub-operation on a second subset of the set of wordlines to remove a second subset of the set of electrons from the second set of gate regions.

2. The memory device of claim 1, wherein the first erase sub-operation comprises a first erase cycle.

3. The memory device of claim 2, wherein the first erase cycle comprises a first set of one or more erase pulses.

4. The memory device of claim 3, wherein each of the first set of one or more erase pulses is followed by an erase verify operation.

5. The memory device of claim 1, the operations further comprising causing a high voltage level to be applied to the second subset of wordlines during the first erase sub-operation, wherein the high voltage level is greater than or equal to an erase voltage level of an erase pulse applied during the first erase sub-operation.

6. The memory device of claim 1, wherein, following the executing of the second erase sub-operation, a third subset of the set of electrons remain in a set of inter-cell regions of a charge trap layer.

7. The memory device of claim 6, the operations further comprising, following the executing of the second erase sub-operation, executing a programming operation to program the first subset of the set of electrons and the second subset of the set of electrons.

8. A method comprising:

causing, during execution of an erase operation to erase a memory block associated with a set of wordlines of a memory device, a programming pulse to be applied to the set of wordlines, wherein the programming pulse causes a set of electrons to be injected into a first set of gate regions and a second set of gate regions;

executing, during the erase operation, a first erase sub-operation on a first subset of the set of wordlines to remove a first subset of the set of electrons from the first set of gate regions; and executing, during the erase operation, a second erase sub-operation on a second subset of the set of wordlines to remove a second subset of the set of electrons from the second set of gate regions.

9. The method of claim 8, wherein the first erase sub-operation comprises a first erase cycle.

10. The method of claim 9, wherein the first erase cycle comprises a first set of one or more erase pulses.

11. The method of claim 10, wherein each of the first set of one or more erase pulses is followed by an erase verify operation.

12. The method of claim 8, further comprising causing a high voltage level to be applied to the second subset of wordlines during the first erase sub-operation, wherein the high voltage level is greater than or equal to an erase voltage level of an erase pulse applied during the first erase sub-operation.

13. The method of claim 9, wherein, following the executing of the second erase sub-operation, a third subset of the set of electrons remain in a set of inter-cell regions of a charge trap layer.

14. The method of claim 13, further comprising, following the executing of the second erase sub-operation, executing a programming operation to program the first subset of the set of electrons and the second subset of the set of electrons.

15. A memory device comprising:

a memory array comprising a set of memory cells; and control logic, operatively coupled with the memory array, to perform operations comprising:

causing, during execution of an erase operation, injection of a set of electrons into a charge trap (CT) layer of the memory device;

causing, by executing a first erase sub-operation of the erase operation, removal of a first subset of the set of electrons from the CT layer of the memory device; and causing, by executing a second erase sub-operation of the erase operation, removal of a second subset of the set of electrons from the CT layer of the memory device.

16. The memory device of claim 15, wherein the first erase sub-operation is executed to remove the first subset of the set of electrons from a first subset of regions of the CT layer corresponding to a first subset of wordlines of the memory device.

17. The memory device of claim 16, wherein the second erase sub-operation is executed to remove the first subset of set of electrons from a second subset of regions of the CT layer corresponding to a second subset of wordlines of the memory device.

18. The memory device of claim 17, the operations further comprising:

causing, during the first erase sub-operation, a first voltage level to be applied to the second subset of wordlines; and causing, during the first erase sub-operation, a ground voltage level to be applied to the first subset of wordlines.

19. The memory device of claim 18, the operations further comprising:

causing, during the second erase sub-operation, a second voltage level to be applied to the first subset of wordlines; and causing, during the second erase sub-operation, the ground voltage level to be applied to the second subset of wordlines.

20. The memory device of claim 15, the operations further comprising executing a programming operation to program the set of memory cells.

* * * * *